(12) United States Patent
Hou et al.

(10) Patent No.: US 8,898,375 B2
(45) Date of Patent: Nov. 25, 2014

(54) MEMORY CONTROLLING METHOD, MEMORY CONTROLLER AND MEMORY STORAGE APPARATUS

(75) Inventors: Chien-Hung Hou, Miaoli County (TW); Hoe-Mang Mark, Miaoli County (TW)

(73) Assignee: Phison Electronics Corp., Miaoli (TW)

( * ) Notice: Subject to any disclaimer, the term of this patent is extended or adjusted under 35 U.S.C. 154(b) by 726 days.

(21) Appl. No.: 13/241,291

(22) Filed: Sep. 23, 2011

(65) Prior Publication Data

US 2013/0013852 A1  Jan. 10, 2013

(30) Foreign Application Priority Data

Jul. 5, 2011 (TW) .............................. 100123648 A

(51) Int. Cl.
| | |
|---|---|
| G06F 13/00 | (2006.01) |
| G06F 13/28 | (2006.01) |
| G06F 12/02 | (2006.01) |
| G11C 16/00 | (2006.01) |

(52) U.S. Cl.
CPC ............ *G06F 12/0246* (2013.01); *G11C 16/00* (2013.01)
USPC .................... 711/103; 711/154; 711/E12.008; 365/220; 365/221

(58) Field of Classification Search
CPC .................... G06F 12/0246; G06F 2212/7205; G06F 2212/7208; G11C 16/00; G11C 16/16
USPC ........... 711/103, 154, E12.008; 365/220, 221
See application file for complete search history.

(56) References Cited

U.S. PATENT DOCUMENTS

| | | | |
|---|---|---|---|
| 6,182,162 B1* | 1/2001 | Estakhri et al. ................. | 710/11 |
| 2005/0144361 A1* | 6/2005 | Gonzalez et al. ............. | 711/103 |
| 2007/0198770 A1* | 8/2007 | Horii et al. ..................... | 711/103 |
| 2007/0204098 A1* | 8/2007 | Eguchi et al. ................. | 711/103 |
| 2011/0060868 A1* | 3/2011 | Haukness ...................... | 711/103 |

OTHER PUBLICATIONS

"U.S. Appl. No. 12/764,583", filed Apr. 21, 2010, p. 1-p. 54.

\* cited by examiner

*Primary Examiner* — Edward Dudek, Jr.
(74) *Attorney, Agent, or Firm* — Jianq Chyun IP Office

(57) ABSTRACT

A memory controlling method, a memory controller and a memory storage apparatus are provided. The method includes identifying whether a transmission mode between the memory storage apparatus and a host system belongs to a first transmission mode or a second transmission mode and grouping memory dies of the memory storage apparatus into a plurality of memory die groups. The method also includes applying a first erasing mode to erase data stored in the memory dies when the transmission mode belongs to the first transmission mode and applying a second erasing mode to erase the data stored in the memory dies when the transmission mode belongs to the second transmission mode, wherein at least a part of the memory die groups are enabled simultaneously in the first erasing mode and any two of the memory die groups are not enabled simultaneously in the second erasing mode.

21 Claims, 9 Drawing Sheets

MEMORY CONTROLLING METHOD, MEMORY CONTROLLER AND MEMORY STORAGE APPARATUS

CROSS-REFERENCE TO RELATED APPLICATION

This application claims the priority benefit of Taiwan application serial no. 100123648, filed Jul. 5, 2011. The entirety of the above-mentioned patent application is hereby incorporated by reference herein and made a part of this specification.

BACKGROUND

1. Technology Field

The present invention relates to a memory controlling method for a rewritable non-volatile memory module, and a memory controller and a memory storage apparatus using the same.

2. Description of Related Art

Digital cameras, cell phones, and MP3 players have undergone rapid growth in recent years, so that consumer demands for storage media have also rapidly increased. A rewritable non-volatile memory is suitable for portable applications and most suitable for portable products powered by battery due to its characteristics such as data non-volatility, low power consumption, small volume, non-mechanical structure, and high read-and-write speed. A pen driver is a storage apparatus which uses a rewritable non-volatile memory as its storage medium. Since the rewritable non-volatile memory has a small size and large capacity, it is widely used for storing personal important data. Thus, in recent years, the rewritable non-volatile memory industry has become a major part of the electronic industry.

A memory die in a memory storage apparatus has a plurality of physical blocks, and each physical block has a plurality of physical pages. When data is written into the physical block, it is sequentially written according to a sequence of the physical pages. Generally, a procedure of writing data to the physical pages includes a command and data transferring stage and a data programming stage. To be specific, when data is to be stored in the physical pages of the memory die, a control circuit of the memory storage apparatus first transmits the command and the data to a buffer of the memory die. Then, the memory die programs (i.e. writes) the data to the physical pages from the buffer. During the process that the control circuit of the memory storage apparatus transmits the data to the memory die, the memory die is in a transmission state. Moreover, during a process that the data is programmed to the physical pages, the memory die is in a busy state.

In order to increase a data writing speed of the memory storage apparatus, the memory storage apparatus is configured with a plurality of memory dies and data is written therein in an interleave manner or a parallel manner. For example, a memory storage apparatus configured with a first and a second memory dies which are coupled to a control circuit through a data input/output bus is taken as an example, when a host system is about to store a plurality of batches of page data (i.e. data having the size which is equal to the capacity of one page) into the memory storage apparatus, the control circuit may transmit one batch of page data to the first memory die. Then, when the first memory die is in the busy state, the control circuit may transmit another batch of page data to the second memory die. Then, when the second memory die is in the busy state, the control circuit may transmit another batch of page data to the first memory die, in this way, by interleavingly transmitting the page data to the first memory die and the second memory die, a data writing time is shortened.

Particularly, when the memory die is in the transmission state or the busy state, the memory die requires power to execute transmission or programming operations. However, regarding a memory card or a pen driver using a power provided by a data transmission interface as a main power, when the memory dies are enabled (i.e. in the busy state or the transmission state) simultaneously, the power provided by the data transmission interface is probably inadequate, which may cause write failure.

Similarly, a procedure of erasing data of a physical block may also include a command transmission stage and a data erasing stage. However, the power required for the memory die to execute a data erasing operation is far eater than the power required for executing a data writing operation. Therefore, it is necessary to develop a memory controlling method to avoid unstableness caused by inadequate power when the erase command is executed in case that the interleave manner or the parallel manner is used to write data.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

The present invention is directed to a memory controlling method, a memory controller and a memory storage apparatus, which avoids unstableness caused by inadequate power when an erase command is executed while considering write performance.

An exemplary embodiment of the present invention provides a memory controlling method for a memory storage apparatus, wherein the memory storage apparatus has a rewritable non-volatile memory module, and the rewritable non-volatile memory module has a plurality of memory dies. The memory controlling method includes identifying whether a transmission mode between the memory storage apparatus and a host system belongs to a first transmission mode or a second transmission mode and grouping the memory dies to a plurality of memory die groups. The method also includes applying a first erasing mode to erase data stored in the memory dies when the transmission mode belongs to the first transmission mode, wherein at least a part of the memory die groups are enabled simultaneously in the first erasing mode. The method also includes applying a second erasing mode to erase the data stored in the memory dies when the transmission mode belongs to the second transmission mode, wherein any two of the memory die groups are not enabled simultaneously in the second erasing mode.

An exemplary embodiment of the present invention provides a memory controller for controlling a rewritable non-volatile memory module, wherein the rewritable non-volatile memory module has a plurality of memory dies. The memory controller includes a host interface, a memory interface, a micro control unit (MCU), a memory management unit, a data transmission mode identifying unit and a memory erasing unit. The host interface is configured for coupling to a host system. The memory interface is configured for coupling to the rewritable non-volatile memory module. The micro control unit is coupled to the host interface and the memory interface. The memory management unit is coupled to the micro control unit, and is configured for grouping the memory dies into a plurality of memory die groups. The data transmission mode identifying unit is coupled to the micro control unit, and is configured for identifying whether a transmission mode between the host interface and the host system belongs to a first transmission mode or a second transmission mode. The memory erasing unit is coupled to the micro control unit. When the transmission mode belongs to the first transmission mode, the memory erasing unit applies a first erasing mode to erase data stored in the memory dies, wherein at least a part of the memory die groups are enabled simultaneously in the first erasing mode. Moreover, when the transmission mode belongs to the second transmission mode, the memory erasing unit applies a second erasing mode to erase the data stored in the memory dies, wherein any two of the memory die groups are not enabled simultaneously in the second erasing mode.

An exemplary embodiment of the present invention provides a memory storage apparatus including a connector, a rewritable non-volatile memory module and a memory controller. The connector is configured for coupling to a host system. The rewritable non-volatile memory module has a plurality of memory dies. The memory controller is coupled to the rewritable non-volatile memory module. The memory controller is configured for grouping the memory dies into a plurality of memory die groups, and identifying whether a transmission mode between the connector and the host system belongs to a first transmission mode or a second transmission mode. Moreover, when the transmission mode belongs to the first transmission mode, the memory controller applies a first erasing mode to erase data stored in the memory dies, wherein at least a part of the memory die groups are enabled simultaneously in the first erasing mode. Moreover, when the transmission mode belongs to the second transmission mode, the memory controller applies a second erasing mode to erase the data stored in the memory dies, wherein any two of the memory die groups are not enabled simultaneously in the second erasing mode.

An exemplary embodiment of the present invention provides a memory controlling method for a memory storage apparatus, wherein the memory storage apparatus has a rewritable non-volatile memory module, and the rewritable non-volatile memory module has a plurality of memory dies and a plurality of data input/output buses coupled to the memory dies. The memory controlling method includes identifying whether a transmission mode between the memory storage apparatus and a host system belongs to a first transmission mode or a second transmission mode. The method also includes applying a first erasing mode to erase data stored in the memory dies when the transmission mode belongs to the first transmission mode, and applying a second erasing mode to erase the data stored in the memory dies when the transmission mode belongs to the second transmission mode, wherein an operating current of the first erasing mode is greater than an operating current of the second erasing mode.

According to the above descriptions, the memory controlling method, the memory controller and the memory storage apparatus provided by the exemplary embodiments may use different erasing modes to execute the data erasing operation according to different transmission modes, so as to avoid unstableness caused by inadequate power supply.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1:
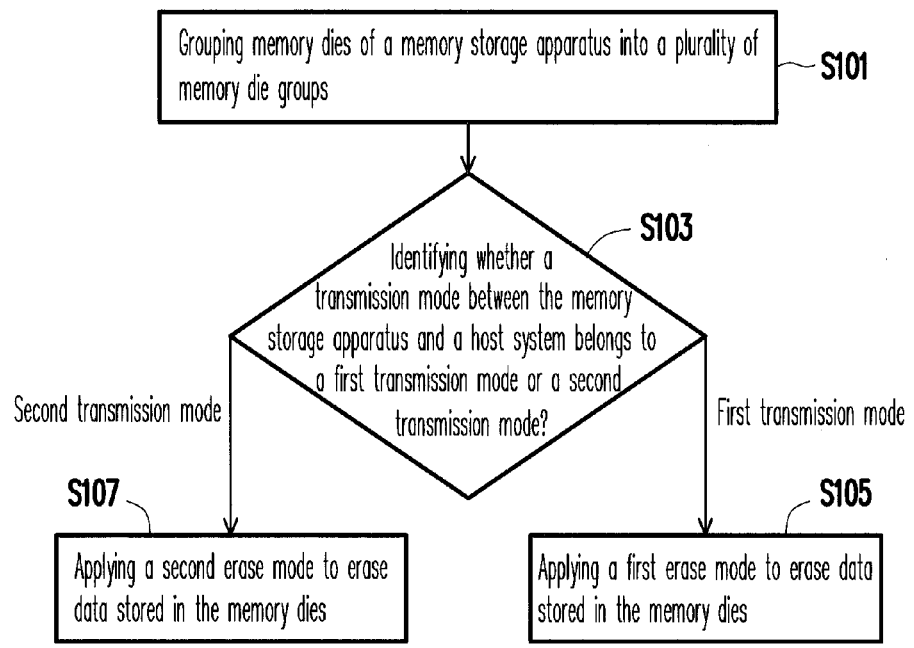
FIG. 1 is a flowchart illustrating a memory controlling method according to an exemplary embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least on of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

In order to avoid system unstableness caused by inadequate power supplied by a data transmission interface, the present invention provides a method controlling method capable of using different data erasing modes according to different data transmission modes. As shown in FIG. 1, in the memory controlling method, memory dies of a memory storage apparatus are grouped into a plurality of memory die groups (S101), and it is identified whether a transmission mode between the memory storage apparatus and a host system belongs to a first transmission mode or a second transmission mode (S103). When the transmission mode belongs to the first transmission mode, a first erasing mode is applied to erase data stored in the memory dies (S105), and when the transmission mode belongs to the second transmission mode, a second erasing mode is applied to erase data stored in the memory dies (S107), wherein an operating current of the first erasing mode is greater than an operating current of the second erasing mode. In detail, for example, the number of memory dies simultaneously enabled in the first erasing mode is greater than the number of memory dies simultaneously enabled in the second erasing mode, so that the operating current of the first erasing mode is greater than the operating current of the second erasing mode. For another example, the number of data input/output buses simultaneously enabled in the first erasing mode is greater than the number of data input/output buses simultaneously enabled in the second erasing mode, so that the operating current of the first erasing mode is greater than the operating current of the second erasing mode. Namely, when the second transmission mode with inadequate power supply is used, the second erasing mode with lower power consumption is used, so as to avoid system unstableness. In order to fully convey the spirit of the invention, several exemplary embodiments are provided blow for descriptions.

Generally, the memory storage apparatus (which is also refereed to as a rewritable non-volatile memory storage system) includes a memory module and a controller (which is also referred to as a control circuit). The memory storage apparatus is generally used together with a host system, so that the host system can write data to the memory storage apparatus or read data from the memory storage apparatus. Moreover, the memory storage apparatus may also include an embedded rewritable non-volatile memory and software capable of being executed on the host system to substantially serving as a controller of the embedded rewritable non-volatile memory.

Figure 2A:
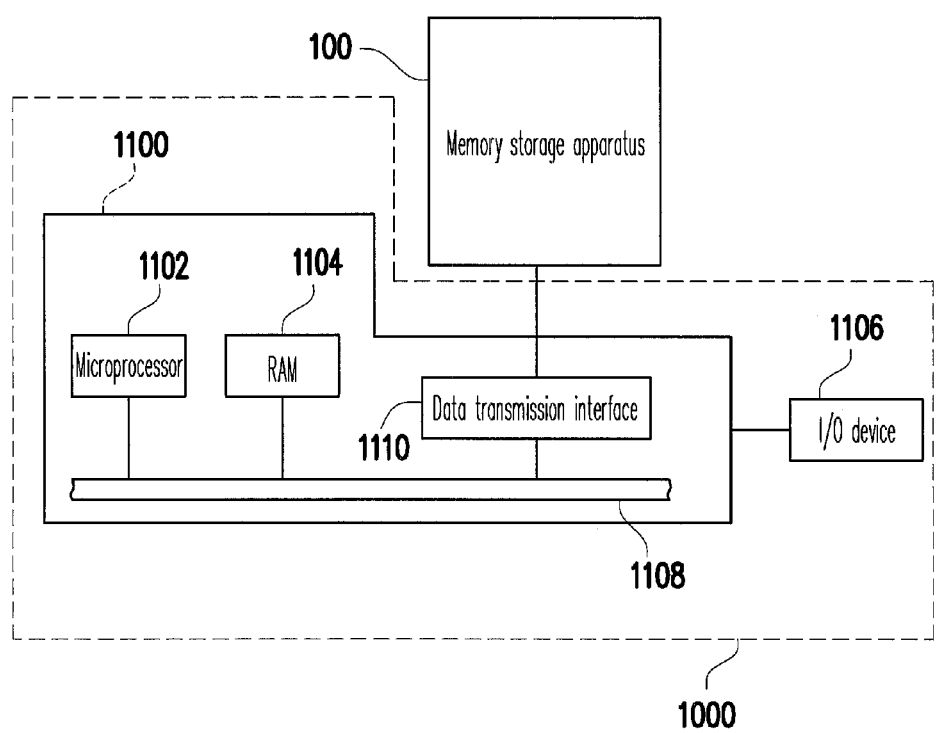
FIG. 2A is a schematic diagram illustrating a host system and a memory storage apparatus coupled to the host system according to an exemplary embodiment of the present invention.

FIG. 2A is a schematic diagram illustrating a host system and a memory storage apparatus coupled to the host system according to an exemplary embodiment of the present invention.

Figure 2B:
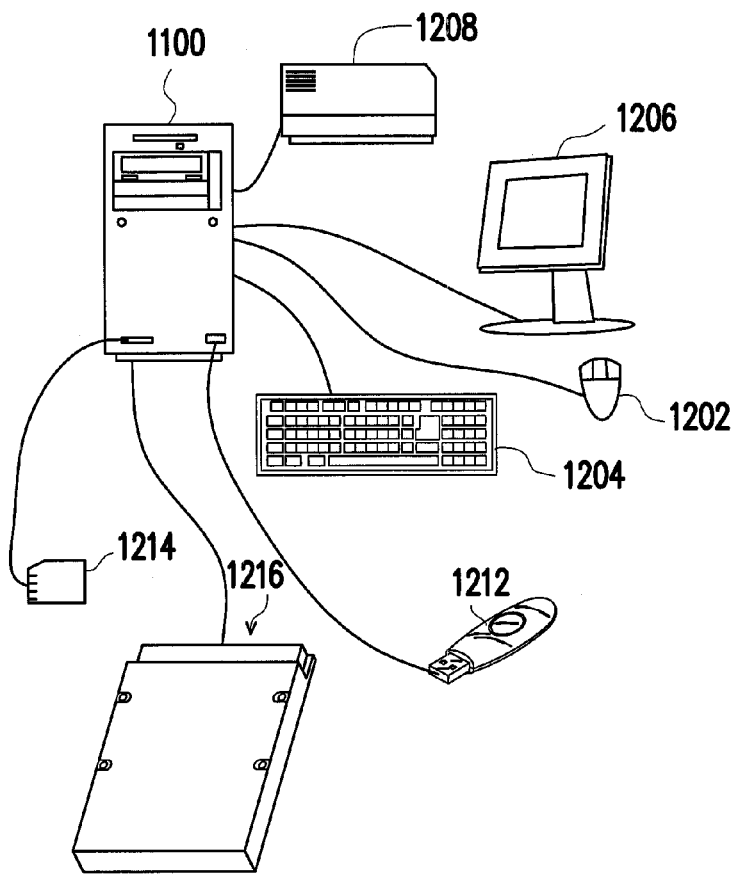
FIG. 2B is a schematic diagram illustrating a computer, input/output devices and memory storage apparatus according to an exemplary embodiment of the present invention.

Referring to FIG. 2A, the host system 1000 generally includes a computer 1100 and an input/output (I/O) device 1106. The computer 1100 includes a microprocessor 1102, a random access memory (RAM) 1104, a system bus 1108 and a data transmission interface 1110. The I/O device 1106 includes a mouse 1202, a keyboard 1204, a display 1206 and a printer 1208 shown in FIG. 2B. It should be noticed that the devices shown in FIG. 2B are not used to limit to the I/O device 1106, and the I/O device 1106 may also include other devices.

In the present embodiment, the memory storage apparatus 100 is coupled to the other devices of the host system 1000 through the data transmission interface 1110. Based on operations of the microprocessor 1102, the RAM 1104, and the I/O device 1106, data can be written into the memory storage apparatus 100 or read from the memory storage apparatus 100. For example, the memory storage apparatus 100 can be a flash drive 1212, a memory card 1214 or a solid state drive (SSD) 1216 shown in FIG. 1B.

Figure 2C:
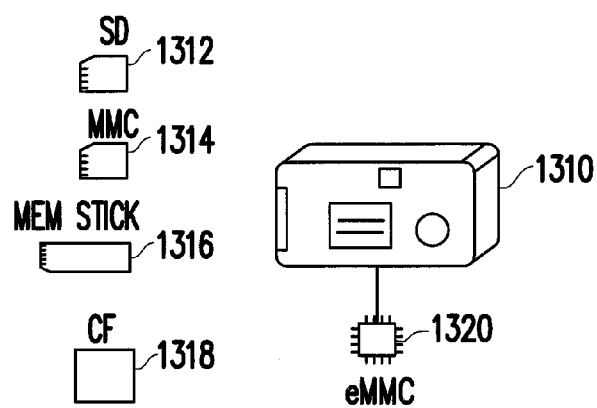
FIG. 2C is a schematic diagram illustrating a host system and memory storage apparatus according to another exemplary embodiments of the present invention.

Generally, the host system 1000 may be any system substantially used together with the memory storage apparatus 100 for storing data. In the present exemplary embodiment, although the host system 1000 implemented by a computer system is taken as an example, in another exemplary embodiment of the present invention, the host system 1000 can also be a digital camera, a video camera, a communication device, an audio player or a video player, etc. For example, when the host system is a digital camera (video camera) 1310, the memory storage apparatus is a secure digital (SD) card 1312, a multimedia card (MMC) card 1314, a memory stick (MS) 1316, a compact flash (CF) card 1318 or an embedded storage device 1320 (shown in FIG. 2C). The embedded storage device 1320 includes an embedded MMC (eMMC).

Figure 3:
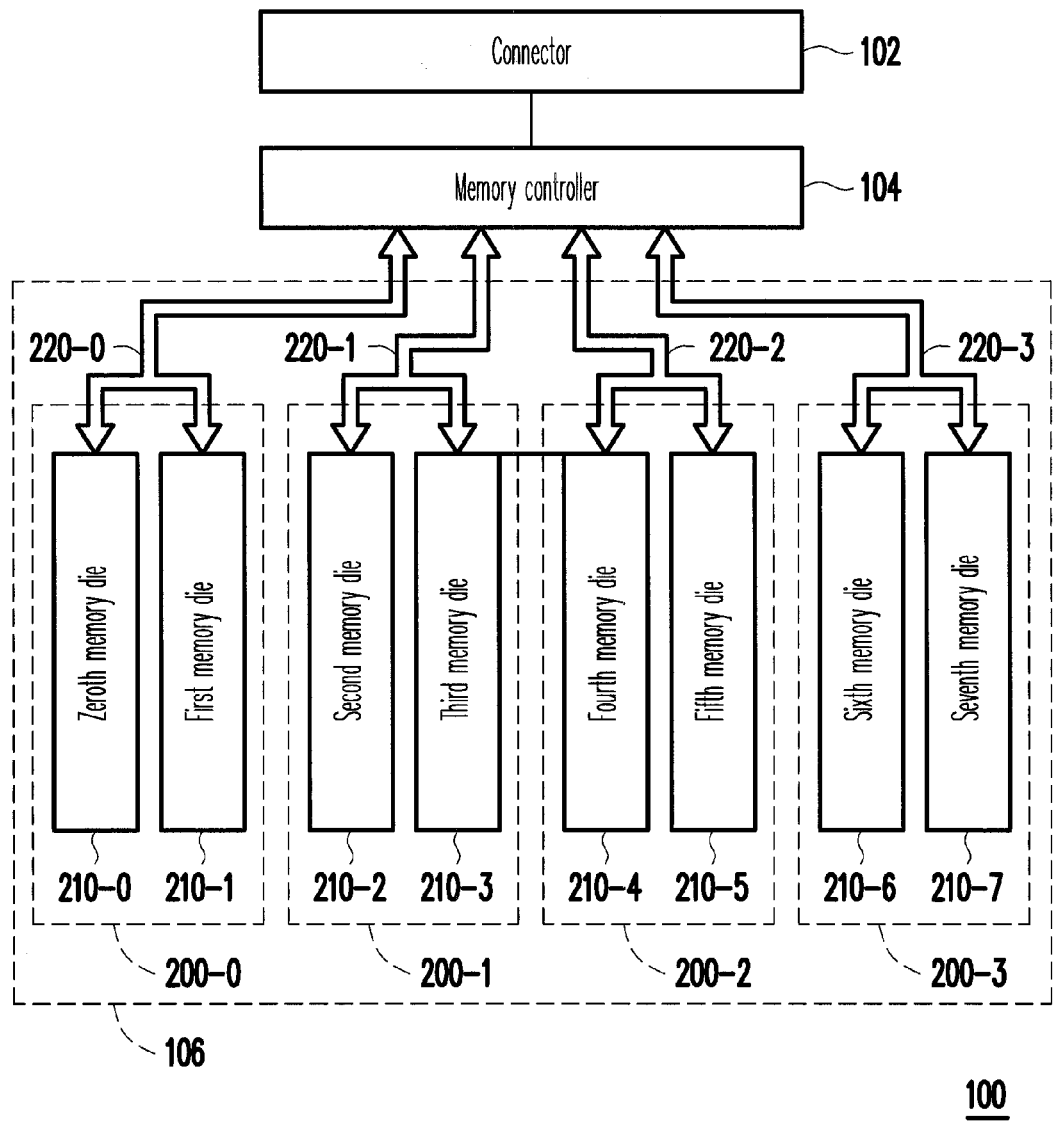
FIG. 3 is a schematic block diagram of a memory storage apparatus of FIG. 2A.

FIG. 3 is a schematic block diagram of a memory storage apparatus of FIG. 2A.

Referring to FIG. 3, the memory storage apparatus 100 includes a connector 102, a memory controller 104 and a rewritable non-volatile memory module 106.

The connector 102 is coupled to the memory controller 104 and is configured for coupling to the host system 1000. In the present exemplary embodiment, the connector 102 is complied with a compact flash (CF) interface standard. However, it should be noticed that the invention is not limited thereto, and the connector 102 may also be complied with an institute of electrical and electronic engineers (IEEE) 1394 standard, a peripheral component interconnect express (PCI express) standard, a serial advanced technology attachment (SATA) standard, a universal serial buss (USB) standard, an MS interface standard, a MMC interface standard, an SD interface standard, an integrated drive electronics (IDE) interface standard or other suitable standards.

The memory controller 104 may execute a plurality of logic gates or control instructions implemented by a hardware form or a firmware form, and may perform a programming (i.e., writing) operation, a reading operation or an erasing operation on the rewritable non-volatile memory module 106 according to operation commands of the host system 1000.

The rewritable non-volatile memory module 106 is coupled to the memory controller 104 and is configured for storing data written by the host system 1000. In the present exemplary embodiment, the rewritable non-volatile memory module 106 is a multi level cell (MLC) NAND flash memory module. However, the present invention is not limited thereto, and the rewritable non-volatile memory module 106 may also be a single level cell (SLC) NAND flash memory module, other flash memory modules or other memory modules having the same characteristic.

In the present exemplary embodiment, the rewritable non-volatile memory module 106 has a zeroth memory unit 200-0, a first memory unit 200-1, a second memory unit 200-2 and a third memory unit 200-3. In the present exemplary embodiment, the zeroth memory unit 200-0 has a zeroth memory die 210-0 and a first memory die 210-1, the first memory unit 200-1 has a second memory die 210-2 and a third memory die 210-3, the second memory unit 200-2 has a fourth memory die 210-4 and a fifth memory die 210-5, and the third memory unit 200-3 has a sixth memory die 210-6 and a seventh memory die 210-7.

Each of the memory dies (i.e. the zeroth memory die 210-0, the first memory die 210-1, the second memory die 210-2, the third memory die 210-3, the fourth memory die 210-4, the fifth memory die 210-5, the sixth memory die 210-6 and the seventh memory die 210-7) has a plurality of memory cells for storing data. Particularly, a data erasing operation has to be first performed on the memory cell stored with data for reusing the memory cell to store new data. In a design of the rewritable non-volatile memory module 106, the memory cells are grouped into a plurality of physical blocks according to a circuit layout thereof. The physical block is the smallest unit for erasing data. Namely, each physical block contains the least number of memory cells that are erased all together. Each physical block has a plurality of physical pages, and the physical page is the smallest unit for programming data. However, in another exemplary embodiment, the smallest unit for writing data may also be a sector or any other unit. In other words, the physical page is the smallest unit for writing data or reading data. Each physical page usually includes a data bit area and a redundant bit area. The data bit area is used for storing user data, and the redundant bit area is used for storing system data (for example, error checking and correcting (ECC) codes).

In the present exemplary embodiment, the memory controller 104 transmits data to the memory units 200-0~200-3 or read data from the memory units 200-0~200-3 through a plurality of data input/output (I/O) buses. In detail, the memory controller 104 transmits commands and data to the zeroth memory die 210-0 and the first memory die 210-1 through a zeroth data I/O bus 220-0; transmits commands and data to the second memory die 210-2 and the third memory die 210-3 through a first data I/O bus 220-1; transmits commands and data to the fourth memory die 210-4 and the fifth memory die 210-4 through a second data I/O bus 220-2; and transmits commands and data to the sixth memory die 210-6 and the seventh memory die 210-7 through a third data I/O bus 220-3.

In the present exemplary embodiment, the physical blocks in each of the memory dies are grouped into a plurality of physical units by the memory controller 104, and management is performed in a unit of physical unit.

Figure 4:
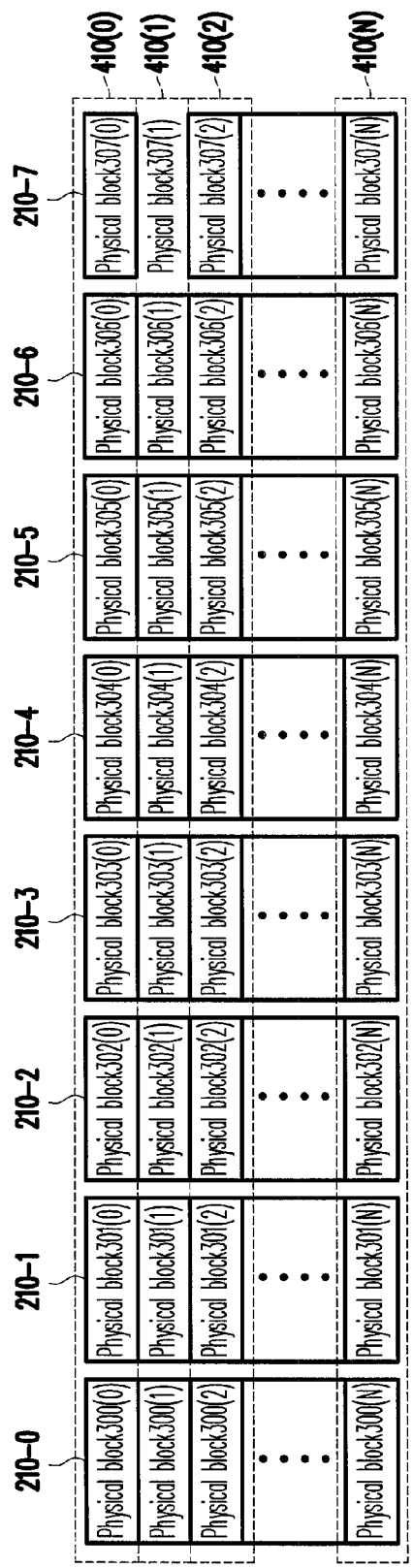
FIG. 4 is an example of grouping physical blocks into physical units according to an exemplary embodiment of the invention.

FIG. 4 is an example of grouping physical blocks into physical units according to an exemplary embodiment of the invention.

Referring to FIG. 4, the memory controller 104 may respectively group physical blocks 300(0)-300(N) of the zeroth memory die 210-0, physical blocks 301(0)-301(N) of the first memory die 210-1, physical blocks 302(0)-302(N) of the second memory die 210-2, physical blocks 303(0)-303(N) of the third memory die 210-3, physical blocks 304(0)-304(N) of the fourth memory die 210-4, physical blocks 305(0)-305(N) of the fifth memory die 210-5, physical blocks 306(0)-306(N) of the sixth memory die 210-6 and physical blocks 307(0)-307(N) of the seventh memory die 210-7 into physical unit 410(0)-410(N).

Particularly, each of the physical units is composed of a physical block of each of the memory dies, so that the memory controller 104 can increase a data accessing speed through a parallel mode and an interleave mode. In detail, since each memory unit in the rewritable non-volatile memory module 106 is coupled to the memory controller 104 through the independent data I/O bus, in a parallel writing mode, the memory controller 104 may simultaneously transmit write data to the corresponding memory module through a plurality of the data I/O buses, so as to improve the write speed. Namely, when a writing operation is performed to a physical unit, since the physical unit is composed of physical blocks of different memory units, in the parallel mode, the memory controller 104 simultaneously transmits and writes data corresponding to the physical pages of different physical blocks through a plurality of the data I/O buses.

Moreover, since each memory unit includes two memory dies, the memory controller 104 may interleavingly transmit data to the two memory dies of a same memory unit, so as to increase the write speed. In detail, as described in the related art, a process of writing data into the memory die includes a command and data transferring stage and a data programming stage. Regarding an interleave writing mode, in the two memory dies that use the same data I/O bus for transmitting data, during a period that one of the memory dies executes a data programming operation, commands and data are transmitted to another memory die.

In the present exemplary embodiment, the memory controller 104 configures logical units to map the physical units. In detail, the memory controller 104 groups a part of the physical units into a data area and a spare area. The physical units of the data area (which are also referred to as data physical units) are regarded as physical units already stored with data, and the physical units of the spare area (which are also referred to as spare physical units) are used to for writing new data. For example, when a write command and data to be written to a certain logical unit are received from the host system 1000, the memory controller 104 selects a physical unit from the spare area to serve as a log physical unit, and writes the data into the log physical unit. Then, when a data merging operation is performed to a certain logical unit, the memory controller 104 selects a physical unit from the spare area to serve as a new data physical unit corresponding to the logical block for writing valid data belonged to the logical unit, and substitute the data physical unit originally mapped to the logical unit.

In the present exemplary embodiment, the memory controller 104 maintains a logical unit-physical unit mapping table to record a mapping relationship between the logical units and the physical units of the data area. Moreover, since the host system 1000 access data in a unit of logical access address (for example, a sector), when the host system 1000 accesses data, the memory controller 104 converts the logical access address corresponding to the memory storage apparatus 100 into corresponding logical page. For example, when the host system 1000 is about to access a certain logical access address, the memory controller 104 converts the logical access address accessed by the host system 1000 into a multidimensional address formed by the corresponding logical unit and the corresponding logical page, and accesses data of the corresponding physical page according to the logical unit-physical unit mapping table.

Figure 5:
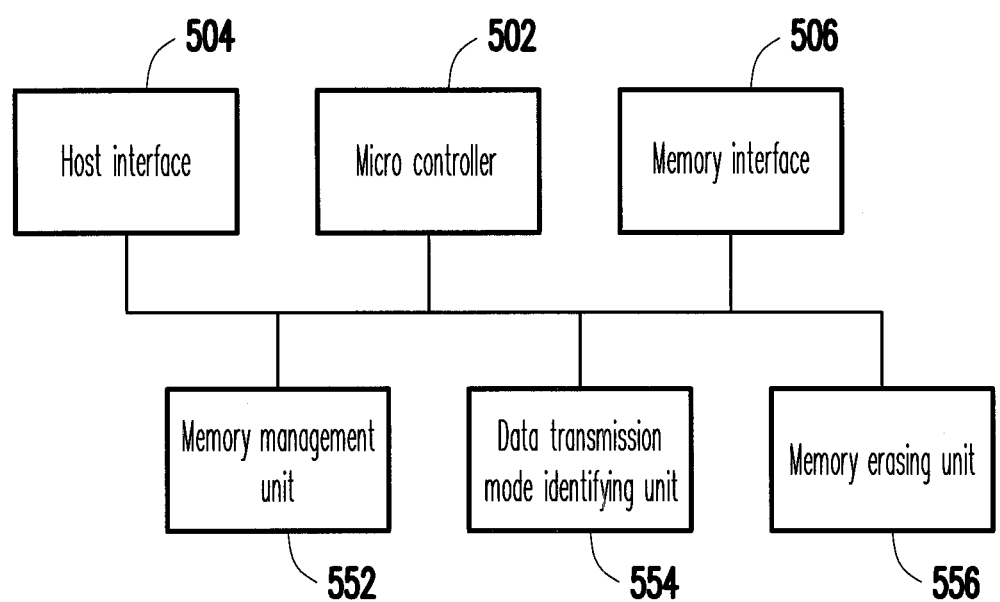
FIG. 5 is a schematic block diagram of a memory controller according to an exemplary embodiment of the invention.

FIG. 5 is a schematic block diagram of a memory controller according to an exemplary embodiment of the present invention.

Referring to FIG. 5, the memory controller 104 includes a micro control unit 502, a host interface 504, a memory interface 506, a memory management unit 552, a data transmission mode identifying unit 554 and a memory erasing unit 556.

The micro control unit 502 is configured for controlling a whole operation of the memory controller 104.

The host interface 504 is coupled to the micro control unit 502 and is configured for receiving and identifying commands and data transmitted by the host system 1000. In the present exemplary embodiment, the host interface 504 is complied with the CF standard. However, it should be noticed that the invention is not limited thereto, and the host interface 504 can also be complied with a parallel advanced technology attachment (PATA) standard, the IEEE 1394 standard, the PCI express standard, the USB standard, the SATA standard, the MS standard, the MMC standard, the SD standard, the IDE standard or other suitable data transmission standards.

The memory interface 506 is coupled to the micro control unit 502, and is configured for accessing the rewritable non-volatile memory module 106. Namely, data to be written into the rewritable non-volatile memory module 106 is converted into a format that can be accepted by the rewritable non-volatile memory module 106 through the memory interface 506.

The memory management unit 552 is coupled to the micro control unit 502, and is configured for managing the rewritable non-volatile memory module 106.

For example, the memory management unit 552 groups the physical blocks into a plurality of physical units for accessing. Moreover, the memory management unit 552 records a mapping relationship of the logical access addresses accessed by the host system 1000 and physical addresses of the physical blocks. In detail, one physical unit is composed of a plurality of physical blocks belonged to different memory dies, and the physical blocks of the rewritable non-volatile memory module 106 stored data in an alternation manner. In the present exemplary embodiment, the memory management unit 552 configures corresponding logical units for mapping to the physical units to facilitate the host system 1000 accessing data. In this way, the memory management unit 552 has to record a constantly varied mapping relationship between the logical units and the physical units (i.e. maintain the logical unit-physical unit mapping table).

It should be noticed that in the present exemplary embodiment, since the memory controller 104 performs data writing operation on the rewritable non-volatile memory module 106 in a unit of each physical unit, when the data writing operation is performed on one physical unit, write commands have to be sent to a plurality of memory dies for writing data into a plurality of the physical blocks in these memory dies. Namely, data belonged to the same logical unit is dispersedly written into a plurality of the memory dies. Similarly, when a data erasing operation is performed on one physical unit, erase commands have to be sent to a plurality of memory dies for erasing data stored in a plurality of the physical blocks in the memory dies.

The data transmission mode identifying unit 554 is coupled to the micro control unit 502, and is configured for identifying whether a transmission mode between the host interface and the host system belongs to a first transmission mode or a second transmission mode. To be specific, when the memory storage apparatus 100 is coupled to the host system 1000, the host system 1000 first sends a command to the memory storage apparatus 100 to query basic information of the memory storage apparatus 100. Then, the memory controller 104 transmits the basic information to the host system 1000, where the basic information includes transmission modes supported by the connector 102. Then, the host system 1000 sends a command to the memory storage apparatus 100 to indicate the transmission mode to be used for transmission. Then, the host interface 504 of the memory controller 104 transmits information related to the adopted transmission mode to the micro control unit 502. Particularly, the data transmission mode identifying unit 554 identifies whether the currently adopted transmission mode belongs to the first transmission mode or the second transmission mode according to the information transmitted by the host interface 504.

For example, taking the CF memory card as an example, a possible transmission mode between the memory storage apparatus and the host system is an ultra direct memory access (UDMA) mode 0-6 or a programmed input/output (PIO) mode. When the transmission mode between the memory storage apparatus 100 and the host system 1000 is the UDMA mode 0-4 or the PIO mode, the data transmission mode identifying unit 554 identifies that the transmission mode between the memory storage apparatus 100 and the host system 1000 belongs to a second transmission mode. Moreover, when the transmission mode between the memory storage apparatus 100 and the host system 1000 is the UDMA mode 5 or the UDMA mode 6, the data transmission mode identifying unit 554 identifies that the transmission mode between the memory storage apparatus 100 and the host system 1000 belongs to a first transmission mode. Namely, the transmission mode with higher transmission rate and larger supplied power is identified as the first transmission mode, and the transmission mode with lower transmission rate and lower supplied power is identified as the second transmission mode.

The memory erasing unit 556 is coupled to the micro control unit 502, and is configured for performing data erasing operations to the rewritable non-volatile memory module 106. Particularly, the memory erasing unit 556 uses different mode to perform the data erasing operation according to whether the transmission mode between the memory storage apparatus 100 and the host system 1000 belongs to the first transmission mode or the second transmission mode.

In detail, the memory management unit 552 groups the memory dies into a plurality of memory die groups according to a configuration of the data I/O buses. For example, the memory management unit 552 groups the zeroth memory die 210-0, the second memory die 210-2, the fourth memory die 210-4 and the sixth memory die 210-6 into a zeroth memory die group, and groups the first memory die 210-1, the third memory die 210-3, the fifth memory die 210-5 and the seventh memory die 210-7 into a first memory die group. Since the zeroth memory die 210-0, the second memory die 210-2, the fourth memory die 210-4 and the sixth memory die 210-6 are respectively connected to the memory controller 104 through different data I/O busses, the memory dies in the zeroth memory die group may simultaneously execute the command sent by the memory controller 104 in a parallel mode. Similarly, since the first memory die 210-1, the third memory die 210-3, the fifth memory die 210-5 and the seventh memory die 210-7 are respectively connected to the memory controller through different data I/O busses, the memory dies in the first memory die group may simultaneously execute the command sent by the memory controller 104 in the parallel mode.

Figure 6:
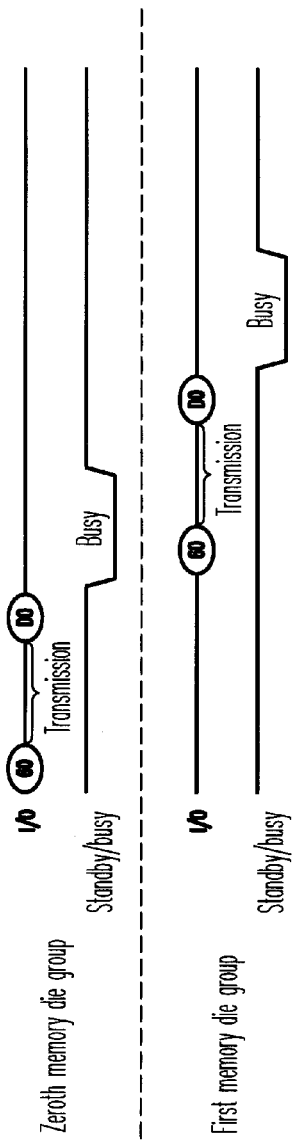
FIG. 6 is a schematic diagram of simultaneously enabling a plurality of memory die groups to execute a data erasing operation according to an exemplary embodiment of the invention.

When a data erasing operation is to be performed on a physical unit and the transmission mode between the memory storage apparatus 100 and the host system 1000 belongs to the first transmission mode, the memory erasing unit 556 synchronously sends an erase command to all of the memory dies in the zeroth memory die group, and during a period that the memory dies of the zeroth memory die group execute the erase command, the memory erasing unit 556 synchronously sends the erase command to the memory dies of the first memory die group (as that shown in FIG. 6), the method of interleavingly sending the erase command to the memory die groups is referred to as an interleaving erasing mode. In detail, under the first transmission mode, since the memory storage apparatus 100 may receive a larger current from the host system 1000, the memory erasing unit 556 may simultaneously enable multiple memory die groups to execute the erasing operation, so as to increase a speed of the erasing operation. Here, the erasing mode corresponding to the first transmission module is also referred to as a first erasing mode.

Figure 7:
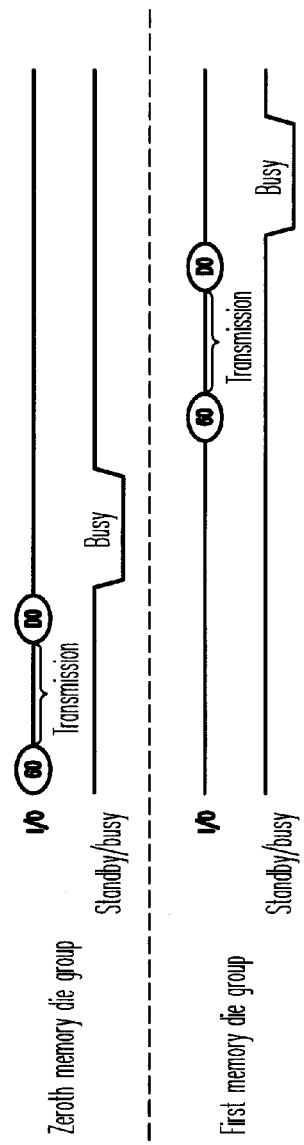
FIG. 7 is a schematic diagram of enabling only one memory die group at a same time to execute a data erasing operation according to an exemplary embodiment of the invention.

When a data erasing operation is to be performed on a physical unit and the transmission mode between the memory storage apparatus 100 and the host system 1000 belongs to the second transmission mode, the memory erasing unit 556 synchronously sends an erase command to all of the memory dies in the zeroth memory die group, and after the memory dies of the zeroth memory die group complete executing the erase command, the memory erasing unit 556 synchronously sends the erase command to the memory dies of the first memory die group (as that shown in FIG. 7). In detail, under the second transmission mode, since the memory storage apparatus 100 receives a smaller current from the host system 1000, to avoid unstableness, the memory erasing unit 556 may only enable one memory die group to execute the erasing operation. Here, the erasing mode corresponding to the second transmission module is also referred to as a second erasing mode.

Figure 8:
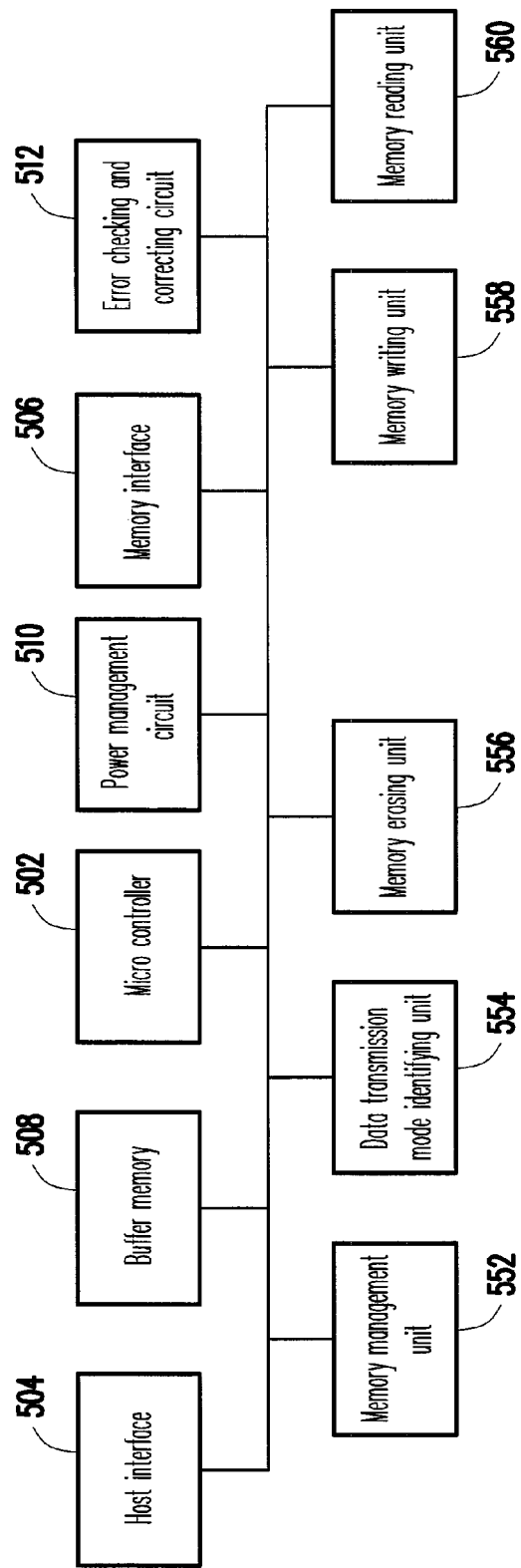
FIG. 8 is a schematic block diagram of a memory controller according to another exemplary embodiment of the invention.

FIG. 8 is a schematic block diagram of a memory controller according to another exemplary embodiment of the invention.

Referring to FIG. 8, besides the aforementioned micro control unit 502, the host interface 504, the memory interface 506, the memory management unit 552, the data transmission mode identifying unit 554 and the memory erasing unit 556, the memory controller 804 further includes a memory writing unit 558.

The memory writing unit 558 is coupled to the micro control unit 502 and is used for writing data into the rewritable non-volatile memory module 106. Particularly, in the present exemplary embodiment, the memory writing unit 558 may simultaneously enable a plurality of the memory die groups to write the write data come from the host system 1000. Namely, the memory writing unit 558 may use the parallel writing mode or the interleave writing mode to write data.

Moreover, the memory controller 804 can also include a memory reading unit 560. The memory reading unit 560 is used for reading data from the rewritable non-volatile memory module 106. Similarly, in the present exemplary embodiment, the data read unit 560 can simultaneously enable a plurality of the memory die groups to read data. Namely, the memory reading unit 560 can use a parallel reading mode or an interleave reading mode to read data.

Moreover, the memory controller 804 may also include a buffer memory 508, a power management circuit 510 and an error checking and correcting (ECC) circuit 512.

The buffer memory 508 is coupled to the micro control unit 502 and is configured for temporarily storing data and commands come from the host system 1000 or data come from the rewritable non-volatile memory module 106.

The power management circuit 510 is coupled to the micro control unit 502 and is configured for controlling a power supply of the memory storage apparatus 100.

The ECC circuit 512 is coupled to the micro control unit 502 and is configured for executing an error checking and correcting procedure to ensure correctness of data. In detail, when the host interface 504 receives a write command from the host system 1000, the ECC circuit 512 generates a corresponding error checking and correcting code (ECC code) for data corresponding to the write command (also referred to as the write data), and the memory writing unit 558 writes the write data and the corresponding ECC code together to the rewritable non-volatile memory module 106. Then, when the memory reading unit 560 reads data from the rewritable non-volatile memory module 106, it simultaneously reads the ECC code corresponding to the data, and the ECC circuit 512 executes the error checking and correcting procedure on the read data according to the ECC code.

It should be noticed that in the present exemplary embodiment, the memory management unit 552, the data transmission mode identifying unit 554, the memory erasing unit 556, the memory writing unit 558 and the memory reading unit 560 are implemented by hardware structures, though the present invention is not limited thereto, and in another exemplary embodiment, the memory management unit 552, the data transmission mode identifying unit 554, the memory erasing unit 556, the memory writing unit 558 and the memory reading unit 560 can also be implemented by a firmware form. For example, control instructions used for implementing the memory management unit 552, the data transmission mode identifying unit 554, the memory erasing unit 556, the memory writing unit 558 and the memory reading unit 560 may be burned to a read only memory of the memory controller. When the memory storage apparatus 100 is in operation, the control instructions are executed by the micro control unit to implement data erasing, writing and reading operations and the memory management operation of the present exemplary embodiment.

Moreover, in another exemplary embodiment, the control instructions used for implementing the memory management unit 552, the data transmission mode identifying unit 554, the memory erasing unit 556, the memory writing unit 558 and the memory reading unit 560 may also be stored in a specific area of the rewritable non-volatile memory module (for example, a system area in the rewritable non-volatile memory module used for storing system data) in form of program codes. For example, a read only memory (not shown) and a random access memory (not shown) are configured in the memory controller, and the read only memory has a boot code. When the memory controller is enabled, the micro control unit first executes the boot code to load the control instructions stored in the rewritable non-volatile memory module to the random access memory, and then executes these control instructions to perform various data operations.

It should be noticed that in the present exemplary embodiment, in the first erasing mode, each two data I/O buses (which is also referred to as a channel) are grouped into one group, and two groups of the channels are alternately used to send the erase command to implement the interleaving erasing operation (as that shown in FIG. 6), so that at least a part of the memory die groups may simultaneously execute the erasing operation to improve the erase speed. And, in the second erasing mode, each two channels are grouped into one group, though the interleaving erasing mode is not used between two groups of the channels to limit the simultaneously enabled memory dies, so as to reduce power consumption.

However, in another exemplary embodiment, the first erasing mode may also be implemented as that four channels are simultaneously used to send the erase command so that all of the memory die groups simultaneously execute the erasing operation, so as to improve the erase speed. And, the second erasing mode may also be implemented as that each two channels are grouped into one group, and the interleaving erasing mode is not used between two groups of the channels, and two channels within one group are alternately used to send the erase command, so as to limit the number of the simultaneously enabled memory dies.

Moreover, in another exemplary embodiment, the first erasing mode may also be implemented as that four channels are alternately used to send the erase command so that all of the memory die groups simultaneously execute the erasing operation, so as to improve the erase speed. And, the second erasing mode may also be implemented as that each two channels are grouped into one group, and the interleaving erasing mode is used between two groups of the channels, and two channels within one group are not alternately used to send the erase command, so as to limit the number of the simultaneously enabled memory dies.

Moreover, in another exemplary embodiment, the first erasing mode may also be implemented as that four channels are simultaneously used to send the erase command so that all of the memory die groups simultaneously execute the erasing operation, so as to improve the erase speed. And, the second erasing mode may also be implemented as that each two channels are grouped into one group, and the interleaving erasing mode is not used between two groups of the channels, and two channels within one group are simultaneously used to send the erase command, so as to limit the number of the simultaneously enabled memory dies.

Figure 9:
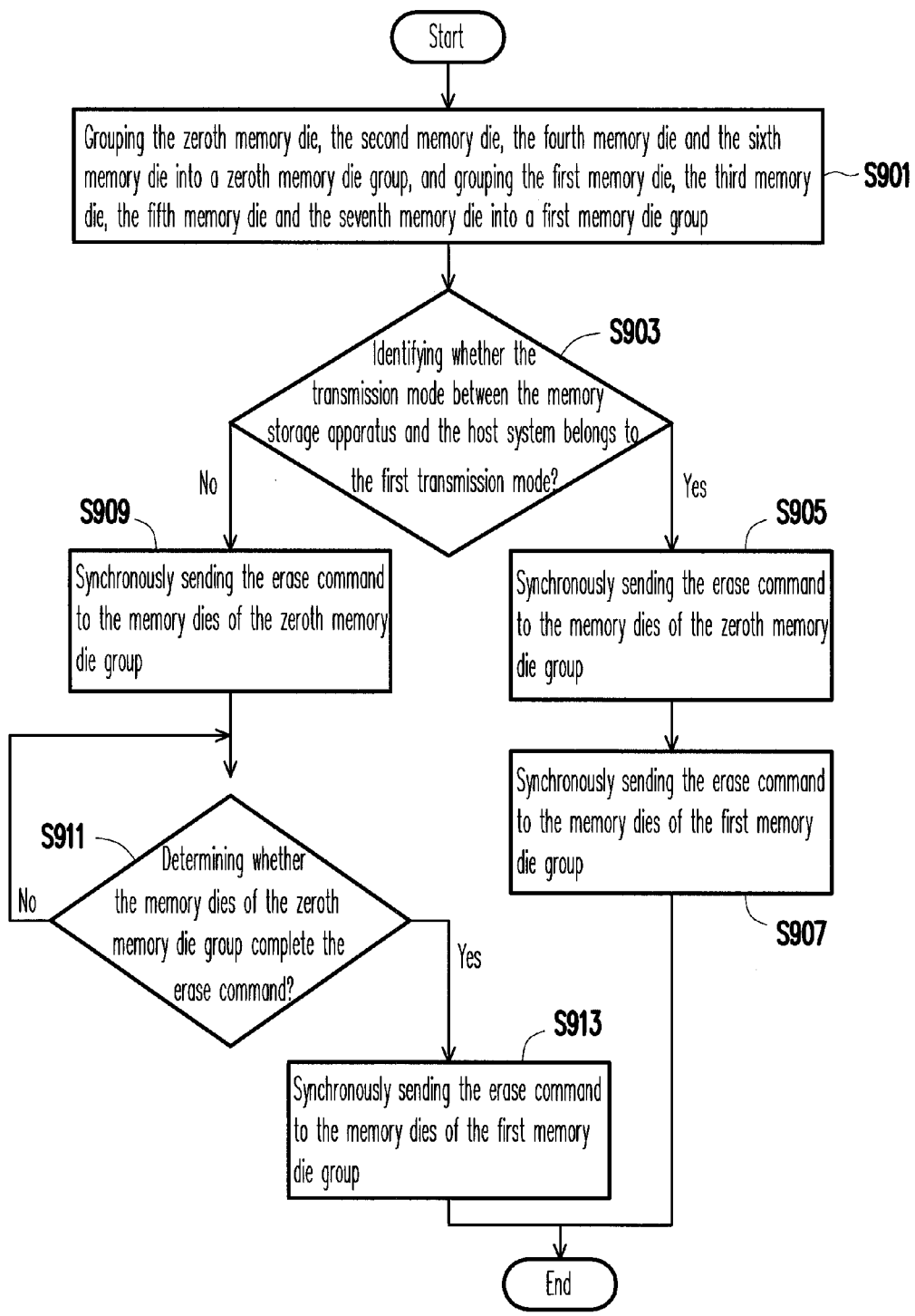
FIG. 9 is a flowchart illustrating a memory controlling method according to an exemplary embodiment of the invention.

FIG. 9 is a flowchart illustrating a memory controlling method according to an exemplary embodiment of the present invention, in which memory controlling steps of executing data erasing operation are introduced.

Referring to FIG. 9, in step S901, the zeroth memory die 210-0, the second memory die 210-2, the fourth memory die 210-4 and the sixth memory die 210-6 are grouped into the zeroth memory die group, and the first memory die 210-1, the third memory die 210-3, the fifth memory die 210-5 and the seventh memory die 210-7 are grouped into the first memory die group.

Then, in step S903, it is identified whether the transmission mode between the memory storage apparatus and the host system belongs to the first transmission mode.

If the transmission mode between the memory storage apparatus and the host system belongs to the first transmission mode, in step S905, the erase command is synchronously sent to the memory dies of the zeroth memory die group, and in step S907, the erase command is synchronously sent to the memory dies of the first memory die group. Namely, in the first erasing mode corresponding to the first transmission mode, at least a part of the memory die groups are simultaneously enabled.

If the transmission mode between the memory storage apparatus and the host system is not belonged to the first transmission mode (i.e. belongs to the second transmission mode), in step S909, the erase command is synchronously sent to the memory dies of the zeroth memory die group, and in step S911, it is determined whether the memory dies of the zeroth memory die group complete the erase command.

If the memory dies of the zeroth memory die group complete the erase command, in step S913, the erase command is synchronously sent to the memory dies of the first memory die group. Conversely, when the memory dies of the zeroth memory die group do not complete the erase command, the step S911 is repeated. Namely, in the second erasing mode corresponding to the second transmission mode, any two of the memory die groups are not enabled simultaneously. Compared to the first erasing mode, in the second erasing mode, less memory dies are simultaneously enabled, and less data I/O buses are simultaneously used. Therefore, in the second transmission mode with less supplied power, the memory storage apparatus 100 can still stably work.

In summary, in the memory controlling method, the memory controller and the memory storage apparatus of the above exemplary embodiments, a plurality of the memory dies are grouped into multiple memory die groups according to a configuration of the data I/O buses. Moreover, when the data erasing operation is executed, the transmission mode used between the memory storage apparatus and the host system is identified, wherein when the transmission mode belongs to the first transmission mode capable of providing a larger current, the memory dies can be simultaneously enabled to execute the data erasing operation, and when the transmission mode belongs to the second transmission mode that cannot provide the larger current, only the memory dies of one memory die group is enabled to perform the data erasing operation. In this way, the memory controlling method, the memory controller and the memory storage apparatus can effectively avoid system unstableness caused by inadequate power when the erase command is executed. The previously described exemplary embodiments of the present invention have the advantages aforementioned, wherein the advantages aforementioned not required in all versions of the invention.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A memory controlling method for a memory storage apparatus, wherein the memory storage apparatus has a rewritable non-volatile memory module, and the rewritable non-volatile memory module has a plurality of memory dies, the memory controlling method comprising:
identifying whether a transmission mode between the memory storage apparatus and a host system belongs to a first transmission mode or a second transmission mode;
grouping the memory dies into a plurality of memory die groups;
applying a first erasing mode to erase data stored in the memory dies when the transmission mode belongs to the first transmission mode, wherein at least a part of the memory die groups are enabled simultaneously in the first erasing mode; and
applying a second erasing mode to erase the data stored in the memory dies when the transmission mode belongs to the second transmission mode, wherein any two of the memory die groups are not enabled simultaneously in the second erasing mode.

2. The memory controlling method as claimed in claim 1, wherein the memory dies comprise a zeroth memory die, a first memory die, a second memory die, a third memory die, a fourth memory die, a fifth memory die, a sixth memory die and a seventh memory die,
wherein the zeroth memory die and the first memory die are coupled to a memory controller of the memory storage apparatus through a zeroth data input/output bus, the second memory die and the third memory die are coupled to the memory controller through a first data input/output bus, the fourth memory die and the fifth memory die are coupled to the memory controller through a second data input/output bus, and the sixth memory die and the seventh memory die are coupled to the memory controller through a third data input/output bus,
wherein the step of grouping the memory dies into the memory die groups comprises:
grouping the zeroth memory die, the second memory die, the fourth memory die and the sixth memory die into a zeroth memory die group; and
grouping the first memory die, the third memory die, the fifth memory die and the seventh memory die into a first memory die group.

3. The memory controlling method as claimed in claim 2, wherein the step of applying the first erasing mode to erase the data stored in the memory dies comprises:

synchronously sending an erase command to the zeroth memory die, the second memory die, the fourth memory die and the sixth memory die of the zeroth memory die group; and synchronously sending the erase command to the first memory die, the third memory die, the fifth memory die and the seventh memory die of the first memory die group while the zeroth memory die, the second memory die, the fourth memory die and the sixth memory die execute the erase command.

4. The memory controlling method as claimed in claim 2, wherein the step of applying the second erasing mode to erase the data stored in the memory dies comprises:

synchronously sending an erase command to the zeroth memory die, the second memory die, the fourth memory die and the sixth memory die of the zeroth memory die group; and synchronously sending the erase command to the first memory die, the third memory die, the fifth memory die and the seventh memory die of the first memory die group after the zeroth memory die, the second memory die, the fourth memory die and the sixth memory die complete executing the erase command.

5. The memory controlling method as claimed in claim 1, further comprising:

simultaneously enabling at least a part of the memory die groups to write a plurality of write data come from the host system.

6. The memory controlling method as claimed in claim 1, further comprising:

identifying the transmission mode between the memory storage apparatus and the host system to be the second transmission mode when the transmission mode between the memory storage apparatus and the host system is an ultra direct memory access (UDMA) mode 0, an UDMA mode 1, an UDMA mode 2, an UDMA mode 3, an UDMA mode 4 or a programmed input/output (PIO) mode; and identifying the transmission mode between the memory storage apparatus and the host system to be the first transmission mode when the transmission mode between the memory storage apparatus and the host system is an UDMA mode 5 or an UDMA mode 6.

7. A memory controller for controlling a rewritable non-volatile memory module, wherein the rewritable non-volatile memory module has a plurality of memory dies, the memory controller comprising:

a host interface, configured to couple to a host system;

a memory interface, configured to couple to the rewritable non-volatile memory module;

a micro control unit, coupled to the host interface and the memory interface;

a memory management unit, coupled to the micro control unit and configured to group the memory dies into a plurality of memory die groups;

a data transmission mode identifying unit, coupled to the micro control unit and configured to identify whether a transmission mode between the host interface and the host system belongs to a first transmission mode or a second transmission mode; and a memory erasing unit, coupled to the micro control unit, wherein when the transmission mode belongs to the first transmission mode, the memory erasing unit applies a first erasing mode to erase data stored in the memory dies, wherein at least a part of the memory die groups are enabled simultaneously in the first erasing mode, wherein when the transmission mode belongs to the second transmission mode, the memory erasing unit applies a second erasing mode to erase the data stored in the memory dies, wherein any two of the memory die groups are not enabled simultaneously in the second erasing mode.

8. The memory controller as claimed in claim 7, wherein the memory dies comprise a zeroth memory die, a first memory die, a second memory die, a third memory die, a fourth memory die, a fifth memory die, a sixth memory die and a seventh memory die, wherein the zeroth memory die and the first memory die are coupled to the memory interface through a zeroth data input/output bus, the second memory die and the third memory die are coupled to the memory interface through a first data input/output bus, the fourth memory die and the fifth memory die are coupled to the memory interface through a second data input/output bus, and the sixth memory die and the seventh memory die are coupled to the memory interface through a third data input/output bus, wherein the memory management unit groups the zeroth memory die, the second memory die, the fourth memory die and the sixth memory die into a zeroth memory die group, and groups the first memory die, the third memory die, the fifth memory die and the seventh memory die into a first memory die group.

9. The memory controller as claimed in claim 8, wherein when the transmission mode is the first transmission mode, the memory erasing unit synchronously sends an erase command to the zeroth memory die, the second memory die, the fourth memory die and the sixth memory die of the zeroth memory die group, and while the zeroth memory die, the second memory die, the fourth memory die and the sixth memory die execute the erase command, the memory erasing unit synchronously sends the erase command to the first memory die, the third memory die, the fifth memory die and the seventh memory die of the first memory die group.

10. The memory controller as claimed in claim 8, wherein when the transmission mode is the second transmission mode, the memory erasing unit synchronously sends an erase command to the zeroth memory die, the second memory die, the fourth memory die and the sixth memory die of the zeroth memory die group, and after the zeroth memory die, the second memory die, the fourth memory die and the sixth memory die complete executing the erase command, the memory erasing unit synchronously sends the erase command to the first memory die, the third memory die, the fifth memory die and the seventh memory die of the first memory die group.

11. The memory controller as claimed in claim 7, wherein further comprising a memory writing unit, wherein the memory writing unit simultaneously enables at least a part of the memory die groups to write a plurality of write data come from the host system.

12. The memory controller as claimed in claim 7, wherein when the transmission mode between the host interface and the host system is an ultra direct memory access (UDMA) mode 0, an UDMA mode 1, an UDMA mode 2, an UDMA mode 3, an UDMA mode 4 or a programmed input/output (PIO) mode, the data transmission mode identifying unit identifies the transmission mode between the host interface and the host system to be the second transmission mode, and when the transmission mode between the host interface and the host system is an UDMA mode 5 or an UDMA mode 6, the data transmission mode identifying unit identifies the transmission mode between the host interface and the host system to be the first transmission mode.

13. A memory storage apparatus, comprising:
a connector, configured to couple to a host system;
a rewritable non-volatile memory module, having a plurality of memory dies; and
a memory controller, coupled to the rewritable non-volatile memory module,
wherein the memory controller is configured to group the memory dies into a plurality of memory die groups, and identify whether a transmission mode between the connector and the host system belongs to a first transmission mode or a second transmission mode,
wherein when the transmission mode belongs to the first transmission mode, the memory controller applies a first erasing mode to erase data stored in the memory dies, wherein at least a part of the memory die groups are enabled simultaneously in the first erasing mode,
wherein when the transmission mode belongs to the second transmission mode, the memory controller applies a second erasing mode to erase the data stored in the memory dies, wherein any two of the memory die groups are not enabled simultaneously in the second erasing mode.

14. The memory storage apparatus as claimed in claim 13, wherein the memory dies comprise a zeroth memory die, a first memory die, a second memory die, a third memory die, a fourth memory die, a fifth memory die, a sixth memory die and a seventh memory die,
wherein the zeroth memory die and the first memory die are coupled to the memory controller through a zeroth data input/output bus, the second memory die and the third memory die are coupled to the memory controller through a first data input/output bus, the fourth memory die and the fifth memory die are coupled to the memory controller through a second data input/output bus, and the sixth memory die and the seventh memory die are coupled to the memory controller through a third data input/output bus,
wherein the memory controller groups the zeroth memory die, the second memory die, the fourth memory die and the sixth memory die into a zeroth memory die group, and groups the first memory die, the third memory die, the fifth memory die and the seventh memory die into a first memory die group.

15. The memory storage apparatus as claimed in claim 14, wherein when the transmission mode is the first transmission mode, the memory controller synchronously sends an erase command to the zeroth memory die, the second memory die, the fourth memory die and the sixth memory die of the zeroth memory die group, and while the zeroth memory die, the second memory die, the fourth memory die and the sixth memory die execute the erase command, the memory controller synchronously sends the erase command to the first memory die, the third memory die, the fifth memory die and the seventh memory die of the first memory die group.

16. The memory storage apparatus as claimed in claim 14, wherein when the transmission mode is the second transmission mode, the memory controller synchronously sends an erase command to the zeroth memory die, the second memory die, the fourth memory die and the sixth memory die of the zeroth memory die group, and after the zeroth memory die, the second memory die, the fourth memory die and the sixth memory die complete executing the erase command, the memory controller synchronously sends the erase command to the first memory die, the third memory die, the fifth memory die and the seventh memory die of the first memory die group.

17. The memory storage apparatus as claimed in claim 13, wherein the memory controller simultaneously enables at least a part of the memory die groups to write a plurality of write data come from the host system.

18. The memory storage apparatus as claimed in claim 13,
wherein when the transmission mode between the connector and the host system is an ultra direct memory access (UDMA) mode 0, an UDMA mode 1, an UDMA mode 2, an UDMA mode 3, an UDMA mode 4 or a programmed input/output (PIO) mode, the memory controller identifies the transmission mode between the connector and the host system to be the second transmission mode, and
when the transmission mode between the connector and the host system is an UDMA mode 5 or an UDMA mode 6, the memory controller identifies the transmission mode between the connector and the host system to be the first transmission mode.

19. A memory controlling method for a memory storage apparatus, wherein the memory storage apparatus has a rewritable non-volatile memory module, and the rewritable non-volatile memory module has a plurality of memory dies and a plurality of data input/output buses coupled to the memory dies, the memory controlling method comprising:
identifying whether a transmission mode between the memory storage apparatus and a host system belongs to a first transmission mode or a second transmission mode;
applying a first erasing mode to erase data stored in the memory dies when the transmission mode belongs to the first transmission mode; and
applying a second erasing mode to erase the data stored in the memory dies when the transmission mode belongs to the second transmission mode,
wherein an operating current of the first erasing mode is greater than an operating current of the second erasing mode.

20. The memory controlling method as claimed in claim 19, wherein the number of the memory dies simultaneously enabled in the first erasing mode is greater than the number of the memory dies simultaneously enabled in the second erasing mode.

21. The memory controlling method as claimed in claim 19, wherein the number of the data input/output buses simultaneously enabled in the first erasing mode is greater than the number of the data input/output buses simultaneously enabled in the second erasing mode.

* * * * *